(12) United States Patent
Mangaser et al.

(10) Patent No.: US 12,088,296 B2
(45) Date of Patent: Sep. 10, 2024

(54) CLOCK GATING USING A CASCADED CLOCK GATING CONTROL SIGNAL

(71) Applicant: ADVANCED MICRO DEVICES, INC., Santa Clara, CA (US)

(72) Inventors: Ramon A. Mangaser, Boxborough, MA (US); Srikanth Reddy Gruddanti, Bangalore (IN); Prasant Kumar Vallur, Bangalore (IN); Krishna Reddy Mudimela Venkata, Bangalore (IN); Oikwan Tsang, Santa Clara, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/554,722

(22) Filed: Dec. 17, 2021

(65) Prior Publication Data

US 2023/0198527 A1    Jun. 22, 2023

(51) Int. Cl.
*H03K 19/20* (2006.01)
*G06F 1/06* (2006.01)
*H03K 3/037* (2006.01)

(52) U.S. Cl.
CPC ............ *H03K 19/20* (2013.01); *G06F 1/06* (2013.01); *H03K 3/037* (2013.01)

(58) Field of Classification Search
CPC ........ H03K 19/20; H03K 3/037; H03K 5/135; H03K 19/0963; H03K 19/096; H03K 5/133; G06F 1/06; G06F 1/10; G06F 1/12; G06F 1/08; G06F 9/3869; G06F 1/04; G06F 1/3237; H03L 7/07; H03L 7/00; H03L 7/0807; H03L 7/08; H03L 7/06; H03L 7/093; G11C 7/222; G11C 7/1087; G11C 19/00; G11C 7/1093
See application file for complete search history.

(56) References Cited

U.S. PATENT DOCUMENTS

| | | | | |
|---|---|---|---|---|
| 4,535,459 A * | 8/1985 | Hogge, Jr. | ............... | H04L 7/033 327/12 |
| 6,121,804 A * | 9/2000 | Bryan | ..................... | H03L 7/089 327/155 |
| 6,630,853 B1 * | 10/2003 | Hamada | ................. | H03K 3/037 327/212 |
| 8,013,637 B2 * | 9/2011 | Shikata | ..................... | G06F 1/08 375/354 |
| 8,466,727 B2 * | 6/2013 | Bancel | ................... | G11C 29/38 327/144 |
| 2009/0066390 A1 * | 3/2009 | Ide | ..................... | H03K 5/15033 327/276 |
| 2018/0082724 A1 * | 3/2018 | Zamani | ................... | H03K 5/133 |
| 2019/0325947 A1 * | 10/2019 | Chen | .................. | H03K 19/1776 |

* cited by examiner

*Primary Examiner* — John W Poos (57) ABSTRACT

A clock circuit for clock gating using a cascaded clock gating control signal, including: a first B-latch accepting, as input, a clock gating control signal and enabled by a first clock signal; a second B-latch accepting, as input, an output from the first B-latch and enabled by a second clock signal; and a first logic outputting, based on the first B-latch, a first gated clock signal; and a second logic outputting, based on the second B-latch, a second gated clock signal.

20 Claims, 5 Drawing Sheets

CLOCK GATING USING A CASCADED CLOCK GATING CONTROL SIGNAL

BACKGROUND

Clock gating involves removing a clock signal provided to portions of a circuit in order to save power. To perform clock gating, the clock signal and a clock gating control signal are provided to logic, with the logic providing output as a function of the clock signal and the clock gating control signal. For a multiphase clock, multiple clock signals each provide output corresponding to a different phase of a clock interval. In order to perform clock gating with a multiphase clock, a clock gating control signal is used to control the output of each clock signal.

DETAILED DESCRIPTION

Clock gating involves removing a clock signal provided to portions of a circuit in order to save power. For example, removing the clock signal provided to flip-flops or other circuitry prevents a state change in the circuits, which consume power. To perform clock gating, the clock signal and a clock gating control signal is provided to some logic, with the logic providing output as a function of the clock signal and the clock gating control signal. As an example, where the clock gating control signal is in a high or active state, the clock signal is output, while some other output (e.g., high or low) will be output while the clock gating control signal is low independent of the clock signal.

For a multiphase clock, multiple clock signals each provide output corresponding to a different phase of a clock interval. As an example, a two-phase clock will include two clock signals, with one clock signal in quadrature (e.g., shifted ninety degrees) relative to the other clock signal. In order to perform clock gating with a multiphase clock, a clock gating control signal is used to control the output of each clock signal. For example, a clock gating control signal routed in parallel to separate logic for each clock signal will allow for clock gating for each control signal. However, such an approach introduces difficulties in ensuring that the clock gating control signal is timed properly relative to each clock signal, thereby introducing the possibility of mistimed or glitched clock signals.

To that end, the present specification sets forth various implementations for clock gating using a cascaded clock gating control signal. In some implementations, a clock circuit for clock gating using a cascaded clock gating control signal includes: a first B-latch accepting, as input, a clock gating control signal and enabled by a first clock signal; a second B-latch accepting, as input, an output from the first B-latch and enabled by a second clock signal; and a first logic outputting, based on an output from the first B-latch and the first clock signal, a first gated clock signal; and a second logic outputting, based on an output from the second B-latch and the second clock signal, a second gated clock signal.

In some implementations, the first logic includes a first AND gate accepting, as input, the first clock signal and the output from the first B-latch and outputting the first gated clock signal; and the second logic includes a second AND gate accepting, as input, the second clock signal and the output from the second B-latch and outputting the second gated clock signal. In some implementations, the first clock signal includes a data (DQ) signal and the second clock signal includes a data strobe (DQS) signal. In some implementations, the second clock signal is in quadrature with the first clock signal. In some implementations, the clock circuit further includes: at least one other B-latch accepting, as input, an output from a sequentially preceding B-latch and enabled by a corresponding clock signal of at least one other clock signal; and at least one other logic outputting, based on output from the at least one other B-latch, at least one other gated clock signal. In some implementations, the at least one other logic includes at least one other AND gate each outputting a corresponding gated clock signal of the at least one other gated clock signal and accepting, as input, the corresponding clock signal and an output of a corresponding B-latch of the at least one other B-latch. In some implementations, the first clock signal, the second clock signal, and the at least one other gated clock signal each correspond to a respective phase of a multiphase gated clock.

The present specification also describes various implementations of a method for clock gating using a cascaded clock gating control signal. Such a method includes: providing, as an enable input to each B-latch of a plurality of B-latches, a corresponding clock signal of a plurality of clock signals; providing, as an input to a first B-latch of the plurality of B-latches, a clock gating control signal; providing, as an input to each B-latch of the plurality of B-latches other than the first B-latch, an output of a sequentially preceding B-latch; and outputting, based on an output of each B-latch of the plurality of B-latches and the plurality of clock signals, a plurality of gated clock signals.

In some implementations, outputting the plurality of clock signals includes outputting, by a plurality of AND gates, the plurality of gated clock signals, wherein each AND gate accepts, as input, an output of a corresponding B-latch and the corresponding clock signal provided as the enable input to the corresponding B-latch. In some implementations, the plurality of clock signals include a data (DQ) signal and a data strobe (DQS) signal. In some implementations, the plurality of clock signals include a first signal and a second signal in quadrature with the first signal. In some implementations, the plurality of clock signals includes more than two clock signals. In some implementations, the plurality of gated clock signals corresponds to a respective phase of a multiphase gated clock.

Also described in this specification are various implementations of an apparatus for clock gating using a cascaded clock gating control signal. Such a system includes a clock signal including: a first B-latch accepting, as input, a clock gating control signal and enabled by a first clock signal; a second B-latch accepting, as input, an output from the first B-latch and enabled by a second clock signal; a first logic outputting, based on an output from the first B-latch and the first clock signal, a first gated clock signal; and a second logic outputting, based on an output from the second B-latch and the second clock signal, a second gated clock signal.

In some implementations, wherein the first logic includes a first AND gate accepting, as input, the first clock signal and the output from the first B-latch and outputting the first gated clock signal; and wherein the second logic includes a second AND gate accepting, as input, the second clock signal and the output from the second B-latch and outputting the second gated clock signal. In some implementations, the clock circuit further includes: at least one other B-latch accepting, as input, an output from a sequentially preceding B-latch and enabled by a corresponding clock signal of at least one other clock signal; and at least one other logic outputting, based on output from the at least one other B-latch, at least one other gated clock signal. In some implementations, the at least one other logic includes at least one other AND gate each outputting a corresponding gated clock signal of the at least one other gated clock signal and accepting, as input, the corresponding clock signal and an output of a corresponding B-latch of the at least one other B-latch. In some implementations, the apparatus further includes a serializer/deserializer (SerDes) operatively coupled to the clock circuit. In some implementations, the apparatus further includes a memory module operatively coupled to the clock circuit. In some implementations, the first clock signal includes a data (DQ) signal and the second clock signal includes a data strobe (DQS) signal.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include implementations in which the first and second features are formed in direct contact, and also include implementations in which additional features be formed between the first and second features, such that the first and second features are not in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to more easily identify various components, and identify that those components are, for example, on opposing sides of another component. The spatially relative terms are intended to encompass different orientations of the device in use or operation in addition to the orientation depicted in the figures.

Figure 1A:
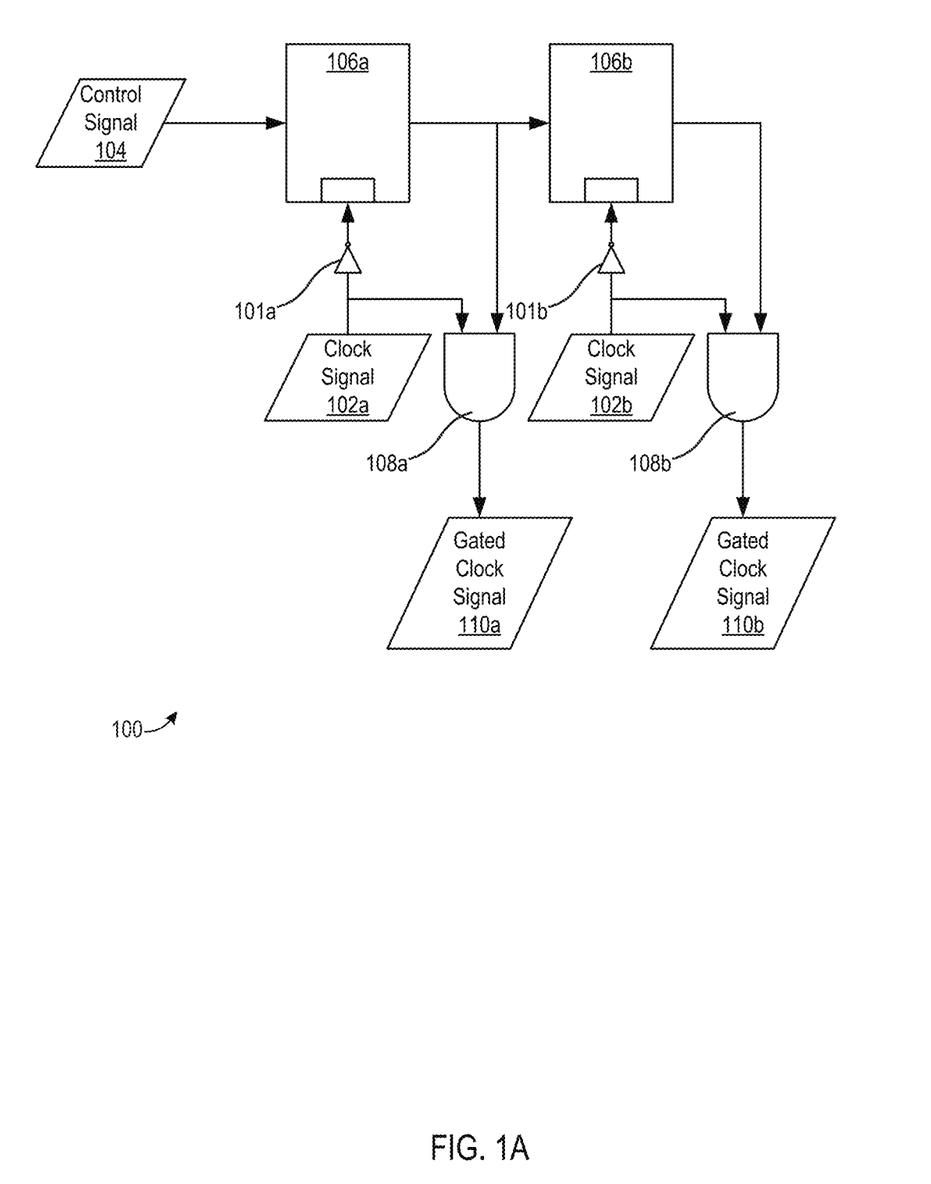
FIG. 1A is a block diagram of an example clock circuit for clock gating using a cascaded clock gating control signal according to some implementations.

FIG. 1A is a block diagram of a non-limiting example clock circuit 100. The example clock circuit 100 can be implemented in a variety of computing devices, including mobile devices, personal computers, peripheral hardware components, gaming devices, set-top boxes, and the like. The clock circuit 100 is a two-phase multiphase clock that accepts a clock signal 102a and a clock signal 102b. In some implementations, the clock signal 102b is in quadrature (e.g., shifted ninety degrees) relative to the clock signal 102a. In other words, in some implementations, the clock signal 102a is an in-phase signal and the clock signal 102b is a quadrature-phase signal. In some implementations, clock signal 102a includes a data (DQ) signal and the clock signal 102b includes a data strobe (DQS) signal.

The clock circuit 100 also accepts a clock gating control signal shown as the control signal 104. The control signal 104 is a signal that controls the gated clock output of the clock circuit 100. The clock signals 102a,b are each provided to corresponding B-latches 106a,b. A B-latch 106a,b is a type of latch similar to a D-latch in that it accepts an input signal and provides an output signal based on an enable input provided to the B-latch 106a,b. Where the enable input is low, the B-latch 106a,b is transparent and provides the input signal as the output signal. Where the enable input is high, the B-latch 106a,b outputs a latched value (e.g., a high value or a low value).

In this example clock circuit 100, the clock signals 102a,b serve as the enable inputs for their corresponding B-latches 106a,b after inversion via inverters 101a,b. The B-latch 106a accepts, as the input signal, the control signal 104 (e.g., the clock gating control signal). The B-latch 106b accepts, as input, the output from the B-latch 106a. Thus, the control signal 104 effectively cascades through the B-latches 106a,b in order to drive clock gating as described below.

In the example clock circuit 100, the output of each B-latch 106a,b is provided as input to a corresponding AND gate 108a,b, with each AND gate 108a,b corresponding to a particular B-latch 106a,b. Each AND gate 108a,b also accepts, as input, the corresponding clock signal 102a,b. Thus, each AND gate 108a,b accepts, as input, a corresponding clock signal 102a,b and a signal based on the control signal 104 as controlled by the B-latches 106a,b. Each AND gate 108a,b outputs a corresponding gated clock signal 110a,b that has been gated based on the outputs of the corresponding B-latches 106a,b. Thus, as set forth above, the control signal 104 effectively cascades through the B-latches 106a,b in order to gate the clock signals 102a,b without the need for parallel routing, thereby ensuring proper timing of the control signal 104 with respect to each clock signal 102a,b, preventing glitches. Although FIG. 1A shows the use of AND gates 108a,b, it is understood that the use of other combinations of functionally similar or equivalent logic are also contemplated within the scope of the present disclosure. Accordingly, any combination of first logic and second logic that outputs gated clock signals based on the clock signals 102a,b and the outputs of the B-latches 106a,b are also contemplated within the scope of the present disclosure.

Figure 1B:
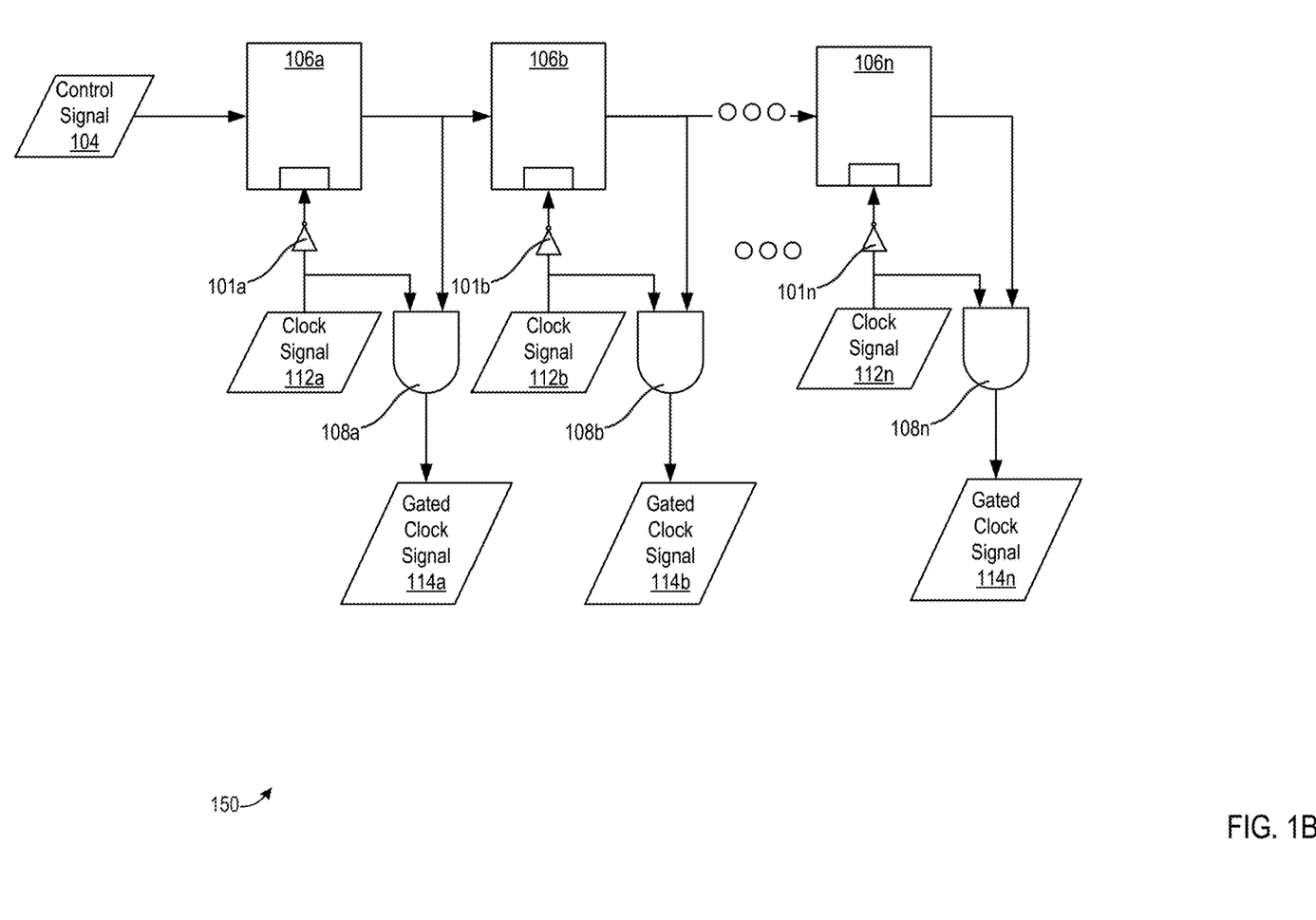
FIG. 1B is a block diagram of an example clock circuit for clock gating using a cascaded clock gating control signal according to some implementations.

FIG. 1B is a block diagram of another non-limiting example clock circuit 150. Whereas the clock circuit 100 shows a two-phase clock circuit 100, the clock circuit 150 shows a multiphase clock circuit 150 supporting any number of clock phases. Similar to the clock circuit 100 of FIG. 1A, the clock circuit 150 accepts a control signal 104 provided as input to a first B-latch 106a. The output of the first B-latch 106a is provided as input to a second B-latch 106b. The B-latches 106a,b accept enable inputs as corresponding clock signals 112a,b. The clock signals 112a,b and the outputs of the B-latches 106a,b are each provided to respective AND gates 108a,b. The AND gates 108a,b each output a respective gated clock signal 114a,b.

The clock circuit 150 of FIG. 1B differs from the clock circuit 100 of FIG. 1A in that the clock circuit 150 of FIG. 1B supports n-numbers of clock phases as shown by clock signals 112a,b-n. Accordingly, the output of the B-latch 106b is cascaded through some number of B-latches, ending with a B-latch 106n. The B-latch 106n accepts a clock signal 112n via an inverter 101n as an enable input and provides output to an AND gate 108n. The AND gate 108n also accepts the clock signal 112n as input and provides, as output, a gated clock signal 114n. Thus, the approaches described herein for cascading a clock gating control signal through B-latches enabled by respective clock signals of different phases are appliable to multiphase clocks of any number of phases.

Figure 2:
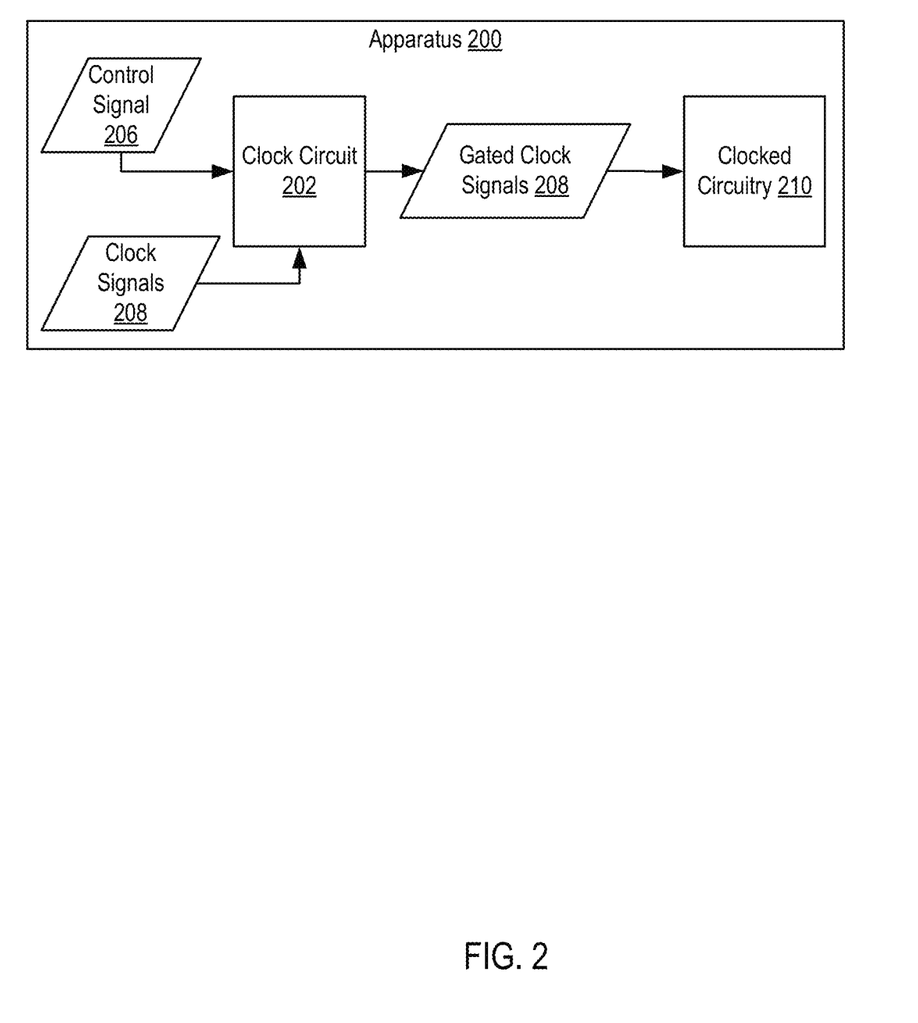
FIG. 2 is a block diagram of an example apparatus for clock gating using a cascaded clock gating control signal according to some implementations.

FIG. 2 shows a block diagram of an example apparatus 200 implementing a clock circuit 202 according to some implementations of the present disclosure. The clock circuit 202 includes, for example, a clock circuit 100 of FIG. 1A or a clock circuit 150 of FIG. 1B. The clock circuit 202 accepts, as input, a control signal 206 such as a control signal 104 of FIGS. 1A and 1B. The clock circuit 204 also accepts clock signals 208. For example, in some implementations, the clock signals 208 include clock signals 102a,b for a two-phase clock as shown in FIG. 1A. As another example, in some implementations, the clock signals 208 include clock signals 112a,b-n of a multiphase clock having n-numbers of phases.

The clock circuit 202 outputs gated clock signals 208. In some implementations, the clock signals 208 include two-phase gated clock signals 110a,b such as in FIG. 1A. In some implementations, the clock signals 208 include n-phase gated clock signals 114a,b-n. The gated clock signals 208 drive clocked circuitry 210. The clock circuitry 210 includes any circuitry capable of being driven or timed by a multi-phase clock, such as a serializer/deserializer (SerDes), a memory module such as Double Data Rate Random Access Memory (DDR RAM), and other clock-driven circuitry as can be appreciated.

In some implementations, the clock circuits 100,150 of FIGS. 1A and 1B are implemented in a computer 300. In addition to at least one processor 302, the computer 300 of FIG. 3 includes random access memory (RAM) 304 which is connected through a high speed memory bus 306 and bus adapter 308 to processor 302 and to other components of the computer 300. Stored in RAM 304 is an operating system 310. The operating system 310 in the example of FIG. 3 is shown in RAM 304, but many components of such software typically are stored in non-volatile memory also, such as, for example, on data storage 312, such as a disk drive.

Figure 3:
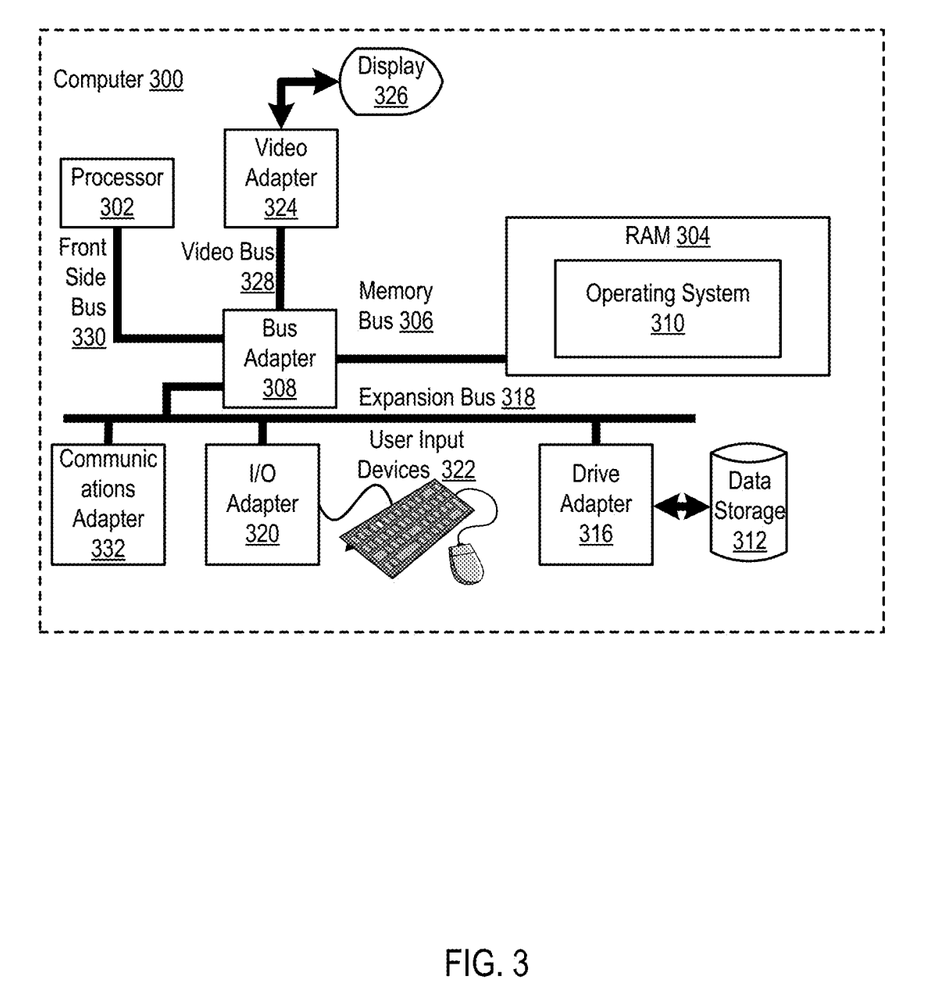
FIG. 3 is a block diagram of an example computer for clock gating using a cascaded clock gating control signal according to some implementations.

The computer 300 of FIG. 3 includes disk drive adapter 316 coupled through expansion bus 318 and bus adapter 308 to processor 302 and other components of the computer 300. Disk drive adapter 316 connects non-volatile data storage to the computer 300 in the form of data storage 312. Such disk drive adapters include Integrated Drive Electronics ('IDE') adapters, Small Computer System Interface (SCSI') adapters, and others as will occur to those of skill in the art. In some implementations, non-volatile computer memory is implemented as an optical disk drive, electrically erasable programmable read-only memory (so-called 'EEPROM' or 'Flash' memory), RAM drives, and so on, as will occur to those of skill in the art.

The example computer 300 of FIG. 3 includes one or more input/output ('I/O') adapters 320. I/O adapters implement user-oriented input/output through, for example, software drivers and computer hardware for controlling output to display devices such as computer display screens, as well as user input from user input devices 322 such as keyboards and mice. The example computer 300 of FIG. 3 includes a video adapter 324, which is an example of an I/O adapter specially designed for graphic output to a display device 326 such as a display screen or computer monitor. Video adapter 324 is connected to processor 302 through a high speed video bus 328, bus adapter 308, and the front side bus 330, which is also a high speed bus.

The exemplary computer 300 of FIG. 3 includes a communications adapter 332 for data communications with other computers and for data communications with a data communications network. Such data communications are carried out serially through RS-232 connections, through external buses such as a Universal Serial Bus ('USB'), through data communications networks such as IP data communications networks, and/or in other ways as will occur to those of skill in the art. Communications adapters 332 implement the hardware level of data communications through which one computer sends data communications to another computer, directly or through a data communications network. Such communication adapters 332 include modems for wired dial-up communications, Ethernet (IEEE 802.3) adapters for wired data communications, and 802.11 adapters for wireless data communications.

Figure 4:
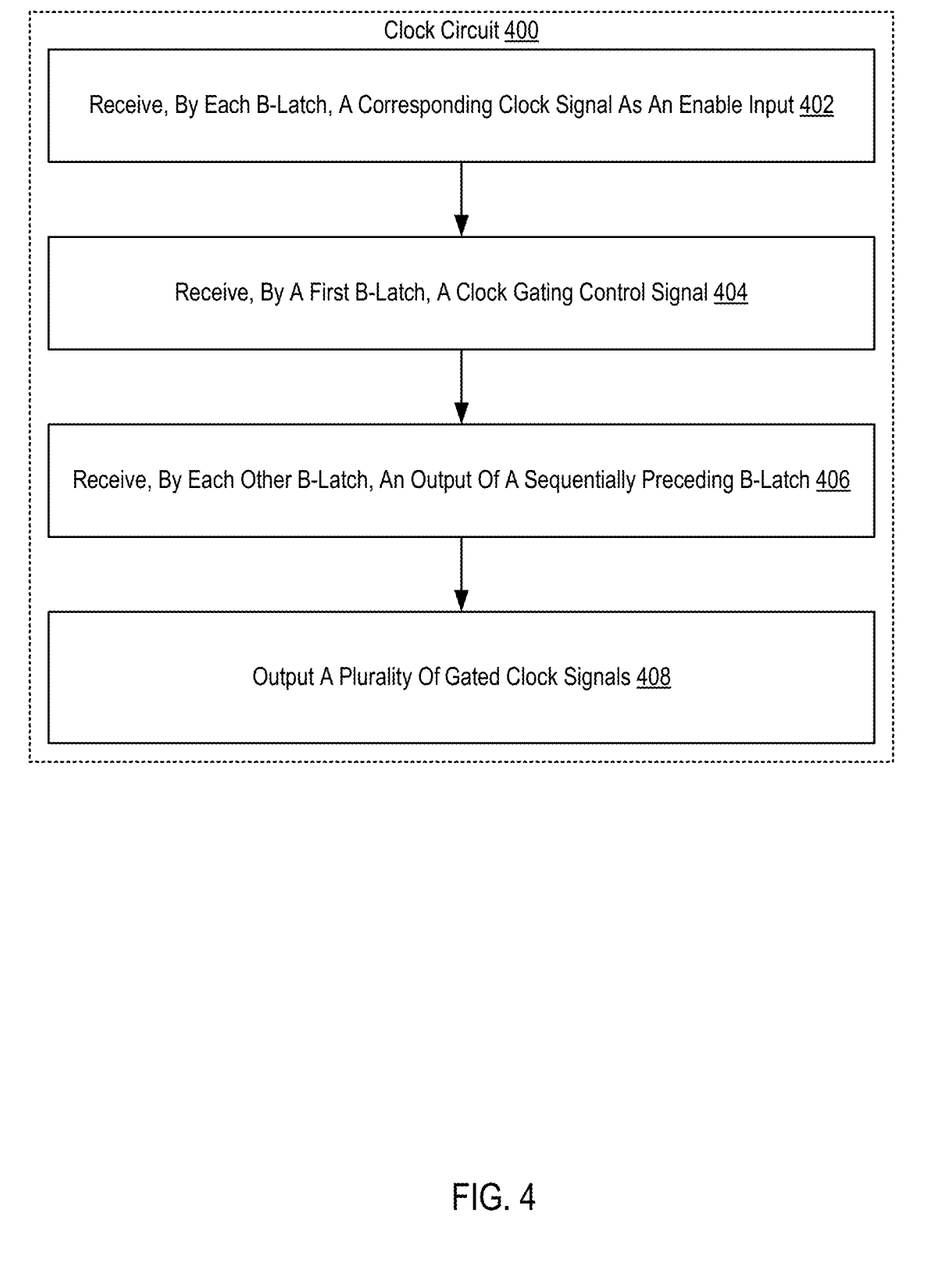
FIG. 4 is a flowchart of an example method for clock gating using a cascaded clock gating control signal according to some implementations.

For further explanation, FIG. 4 sets forth a flow chart illustrating an example method for clock gating using a cascaded clock gating control signal. The example method of FIG. 4 is performed, for example, in a clock circuit 400. The clock circuit 400 includes, for example, a clock circuit 100 of FIG. 1A or a clock circuit 150 of FIG. 1B. The method of FIG. 4 includes receiving 402, by a B-latch (e.g., of the clock circuit 400), a clock signal as an enable input.

A B-latch is a type of latch similar to a D-latch in that it accepts an input signal and provides an output signal based on an enable input provided to the B-latch. Where the enable input is low, the B-latch is transparent and provides the input signal as the output signal. Where the enable input is high, the B-latch outputs a latched value (e.g., a high value or a low value). In the clock circuit 400 of FIG. 4, there can be any number B-latches. Each of the B-latches receives a corresponding clock signal from a number of different clock signals (e.g., in a multiphase clock driven by multiple clock signals). In some implementations, the plurality of B-latches includes a first B-latch 106a and a second B-latch 106b. Accordingly, in such an implementation, the plurality of clock signals includes a first clock signal 102a and a second clock signal 102b of a two-phase clock. As an example, in some implementations, the first clock signal 102a includes an in-phase signal and the second clock signal 102b includes a quadrature-phase signal. In some implementations, the first clock signal 102a includes a data (DQ) signal and the second clock signal 102b includes a data strobe (DQS) signal.

In some implementations, the clock circuit 400 includes more than two B-latches 106a,b-n for an n-phase multiphase clock like that shown in FIG. 1B. Accordingly, in such an implementation, the clock signals include clock signals 112a,b-n as shown in FIG. 1B. The clock signals serve as the enable inputs to the B-latches in that each B-latch will output either a latched value or will be transparent depending on the state of the received clock signal.

The method of FIG. 4 also includes receiving 404, by a first B-latch 106a (e.g., a first B-latch 106a), a clock gating control signal. The clock gating control signal includes, for example, a control signal 104 as shown in FIGS. 1A and 1B. The clock gating control signal is received by the first B-latch 106a as an input signal. The method of FIG. 4 also includes receiving 406, by each other B-latch (that is, any B-latch other than the 'first' B-latch mentioned above), an output of a sequentially preceding B-latch. Each B-latch receives, as an input signal, the output of the sequentially preceding B-latch. For example, the output of the first B-latch 106a of FIG. 1A or FIG. 1B is provided as input to the second B-latch 106b of FIG. 1A and FIG. 1B and so on for each subsequent B-latch.

The method of FIG. 4 also includes outputting 408 a plurality of gated clock signals (e.g., gated clock signals 110a,b, gated clock signals 114a,b-n). The gated clock signals are based on the output of each B-latch as the output of the B-latches is based on the clock gating control signal, thereby gating each of the plurality of clock signals. For example, in some implementations, outputting 408 the plurality of gated clock signals includes outputting, by a plurality of AND gates (e.g., AND gates 108a,b, AND gates 108a,b-n), the plurality of gated clock signals. In such an implementation, each AND gate accepts, as input, a corresponding clock signal and an output of a corresponding B-latch, thereby allowing the clock gating control signal cascaded through the B-latches to gate the clock signals via the AND gates.

In this example clock circuit 100, the clock signals 102a,b serve as the enable inputs for their corresponding B-latch 106a,b. The B-latch 106a accepts, as the input signal, the control signal 104 (e.g., the clock gating control signal). The B-latch 106b accepts, as input, the output from the B-latch 106a. Thus, the control signal 104 effectively cascades through the B-latches 106a,b in order to drive clock gating as described below.

In view of the explanations set forth above, readers will recognize that the benefits of clock gating using a cascaded clock gating control signal include improved performance of a computing system by allowing for glitch-resistant clock gating of multiphase clocks without requiring parallel routing of the clock gating control signal.

Exemplary implementations of the present disclosure are described largely in the context of a fully functional computer system for clock gating using a cascaded clock gating control signal. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary implementations described in this specification are oriented to software installed and executing on computer hardware, nevertheless, alternative implementations implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some implementations, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A clock circuit for clock gating using a cascaded clock gating control signal, comprising:
   a first B-latch accepting, as input, a clock gating control signal and enabled by a first clock signal of a multiphase clock;
   a second B-latch accepting, as input, an output from the first B-latch and enabled by a second clock signal of the multiphase clock instead of the first clock signal of the multiphase clock, wherein the output from the first B-latch varies based on the first clock signal to one of a value latched by the first B-latch or the input of the first B-latch and an output from the second B-latch varies based on the second clock signal to either a value latched by the second B-latch or the input of the second B-latch;
   a first logic outputting, based on the first B-latch, a first gated clock signal; and
   a second logic outputting, based on the second B-latch, a second gated clock signal.

2. The clock circuit of claim 1:
   wherein the first logic comprises a first AND gate accepting, as input, the first clock signal and the output from the first B-latch and outputting the first gated clock signal; and
   wherein the second logic comprises a second AND gate accepting, as input, the second clock signal and the output from the second B-latch and outputting the second gated clock signal.

3. The clock circuit of claim 1, wherein the first clock signal comprises a data (DQ) signal and the second clock signal comprises a data strobe (DQS) signal.

4. The clock circuit of claim 1, wherein the second clock signal is in quadrature with the first clock signal.

5. The clock circuit of claim 1, further comprising:
   at least one other B-latch accepting, as input, an output from a sequentially preceding B-latch and enabled by a corresponding clock signal of at least one other clock signal; and
   at least one other logic outputting, based on the at least one other B-latch, at least one other gated clock signal.

6. The clock circuit of claim 5, wherein the at least one other logic comprises at least one other AND gate each outputting a corresponding gated clock signal of the at least one other gated clock signal and accepting, as input, the corresponding clock signal and an output of a corresponding B-latch of the at least one other B-latch.

7. The clock circuit of claim 5, wherein the first clock signal, the second clock signal, and the at least one other gated clock signal each correspond to a respective phase of a multiphase gated clock.

8. A method of clock gating using a cascaded clock gating control signal, the method comprising:
   receiving, by each B-latch of a plurality of B-latches, a corresponding clock signal of a plurality of clock signals of a multiphase clock as an enable input;
   receiving, by a first B-latch of the plurality of B-latches, a clock gating control signal;
   receiving, by each B-latch of the plurality of B-latches other than the first B-latch, an output of a sequentially preceding B-latch; and
   outputting, based on an output of each B-latch of the plurality of B-latches and the plurality of clock signals, a plurality of gated clock signals, wherein the output from the first B-latch varies based on the first clock signal to one of a value latched by the first B-latch or the input of the first B-latch and an output from the second B-latch varies based on the second clock signal to either a value latched by the second B-latch or the input of the second B-latch ;.

9. The method of claim 8, wherein outputting the plurality of clock signals comprises outputting, by a plurality of AND gates, the plurality of gated clock signals, wherein each AND gate accepts, as input, an output of a corresponding B-latch and the corresponding clock signal provided as the enable input to the corresponding B-latch.

10. The method of claim 8, wherein the plurality of clock signals comprise a data (DQ) signal and a data strobe (DQS) signal.

11. The method of claim 8, wherein the plurality of clock signals comprise a first signal and a second signal in quadrature with the first signal.

12. The method of claim 8, wherein the plurality of clock signals comprises more than two clock signals.

13. The method of claim 8, wherein each of the plurality of gated clock signals corresponds to a respective phase of a multiphase gated clock.

14. An apparatus for clock gating using a cascaded clock gating control signal, comprising:
 a clock circuit comprising:
  a first B-latch accepting, as input, a clock gating control signal and enabled by a first clock signal of a multiphase clock;
  a second B-latch accepting, as input, an output from the first B-latch and enabled by a second clock signal of the multiphase clock instead of the first clock signal of the multiphase clock, wherein the output from the first B-latch varies based on the first clock signal to one of a value latched by the first B-latch or the input of the first B-latch and an output from the second B-latch varies based on the second clock signal to either a value latched by the second B-latch or the input of the second B-latch;
  a first logic outputting, based on the first B-latch, a first gated clock signal; and
  a second logic outputting, based on the second B-latch, a second gated clock signal.

15. The apparatus of claim 14:
 wherein the first logic comprises a first AND gate accepting, as input, the first clock signal and the output from the first B-latch and outputting the first gated clock signal; and
 wherein the second logic comprises a second AND gate accepting, as input, the second clock signal and the output from the second B-latch and outputting the second gated clock signal.

16. The apparatus of claim 14, wherein the clock circuit further comprises:
 at least one other B-latch accepting, as input, an output from a sequentially preceding B-latch and enabled by a corresponding clock signal of at least one other clock signal; and
 at least one other logic outputting, based on the at least one other B-latch, at least one other gated clock signal.

17. The apparatus of claim 16, wherein the at least one other logic comprises at least one other AND gate each outputting a corresponding gated clock signal of the at least one other gated clock signal and accepting, as input, the corresponding clock signal and an output of a corresponding B-latch of the at least one other B-latch.

18. The apparatus of claim 14, further comprising a serializer/deserializer (SerDes) operatively coupled to the clock circuit.

19. The apparatus of claim 14, further comprising a memory module operatively coupled to the clock circuit.

20. The apparatus of claim 14, wherein the first clock signal comprises a data (DQ) signal and the second clock signal comprises a data strobe (DQS) signal.

* * * * *